United States Patent [19]

Ohno et al.

[11] Patent Number: 5,040,043
[45] Date of Patent: Aug. 13, 1991

[54] POWER SEMICONDUCTOR DEVICE

[75] Inventors: Terukaza Ohno; Katsutoshi Izumi, both of Kanagawa, Japan

[73] Assignee: Nippon Telegraph and Telephone Corporation, Tokyo, Japan

[21] Appl. No.: 420,185

[22] Filed: Oct. 12, 1989

[30] Foreign Application Priority Data

Oct. 12, 1988 [JP] Japan ................ 63-256851

[51] Int. Cl.$^5$ .............................. H01L 27/02
[52] U.S. Cl. ...................... 357/42; 357/49; 357/50; 357/23.4; 357/38
[58] Field of Search ............ 357/42, 43, 38, 39, 357/47, 49, 50, 23.4

[56] References Cited

U.S. PATENT DOCUMENTS

| | | | |
|---|---|---|---|
| 4,079,506 | 3/1978 | Suzuki et al. | 357/47 |
| 4,593,458 | 6/1986 | Adler | 357/42 |
| 4,685,198 | 8/1987 | Kawakita et al. | 357/49 |
| 4,767,722 | 8/1988 | Blanchard | 357/23.4 |

FOREIGN PATENT DOCUMENTS

| | | | |
|---|---|---|---|
| 61-46042 | 3/1986 | Japan | 357/42 |
| 61-67253 | 4/1986 | Japan | 357/43 |
| 61-97858 | 5/1986 | Japan | 357/42 |
| 61-137365 | 6/1986 | Japan | 357/38 |
| 61-184862 | 8/1986 | Japan | 357/49 |
| 61-230333 | 10/1986 | Japan | 357/49 |
| 61-290753 | 12/1986 | Japan | 357/42 |
| 62-117359 | 5/1987 | Japan | 357/42 |
| 63-142851 | 6/1988 | Japan | 357/42 |
| 63-199454 | 8/1988 | Japan | 357/38 |

OTHER PUBLICATIONS

Proceedings of 1988 International Symposium of Power Semiconductor Devices, 8/22-23/88, "Intelligent Power Technology-A Reality in the 1990s", pp. 88-95, by Cini et al.
International Electron Devices meeting 1987, Washington, D.C., Dec. 6-9, 1987, Design of High Side Driver in Multipower-BCD and Vipower Technologies, C. Contiero et al., SGS Microelettronica S.p.A., Monolothic Microsystem Division, 20010 Cornaredo, Milan, Italy.
International Electron Devices meeting 1982 San Francisco, Calif., Dec. 13-14-15, The Insulated Gate Rectifier (IGR): A New Power Switching Device, B. J. Baliga et al., General Electric Company Corporate Research and Development Center Schenectady, NY.
IEEE Transactions on Electron Devices, vol. ED-34, No. 4, Apr. 1987, An Ultra-Low On-Resistance Power MOSFET Fabricated by Using a Fully Self-Aligned Process, Daisuke Ueda et al.
Proceedings of the IEEE 1987 Custom Integrated Circuits Conference, The Portland Hilton, Portland, Oregon, Educational Sessions the Westin Benson, Dielectrically Isolated Intelligent Power Switch, Yu Ohata et al., Toshiba Semiconductor, Division 1, Komukai Toshiba-cho, Saiwai-ku, Kawasaki, Japan.
IEEE Electron Device Letters, vol. EDL-4, No. 12, Dec. 1983, Fast-Switching Insulated Gate Transistors, B. J. Baliga, Fellow, IEEE.

Primary Examiner—Rolf Hille
Assistant Examiner—Steven Loke
Attorney, Agent, or Firm—Townsend & Townsend

[57] ABSTRACT

A power semiconductor device includes a layered first insulating region (101) formed on a first major surface of a semiconductor layer (58), a first conductive layer (104, 105, 106, 107, 108, 109) formed on the first insulating region and having the same conductivity type as that of the semiconductor layer, a layered second insulating region (100) formed on the first conductive layer, a vertical power transistor (A) having the semiconductor layer as one of its components and formed on the first major surface of the semiconductor layer, a third insulating region (102) for dielectrically isolating the first conductive layer from the other conductive layer, and a control MIS transistor (B, C), formed on the second insulating region, for controlling the vertical power transistor. A predetermined bias is applied on the first conductive layer to prevent formation of a back channel of the control MIS transistor.

12 Claims, 15 Drawing Sheets

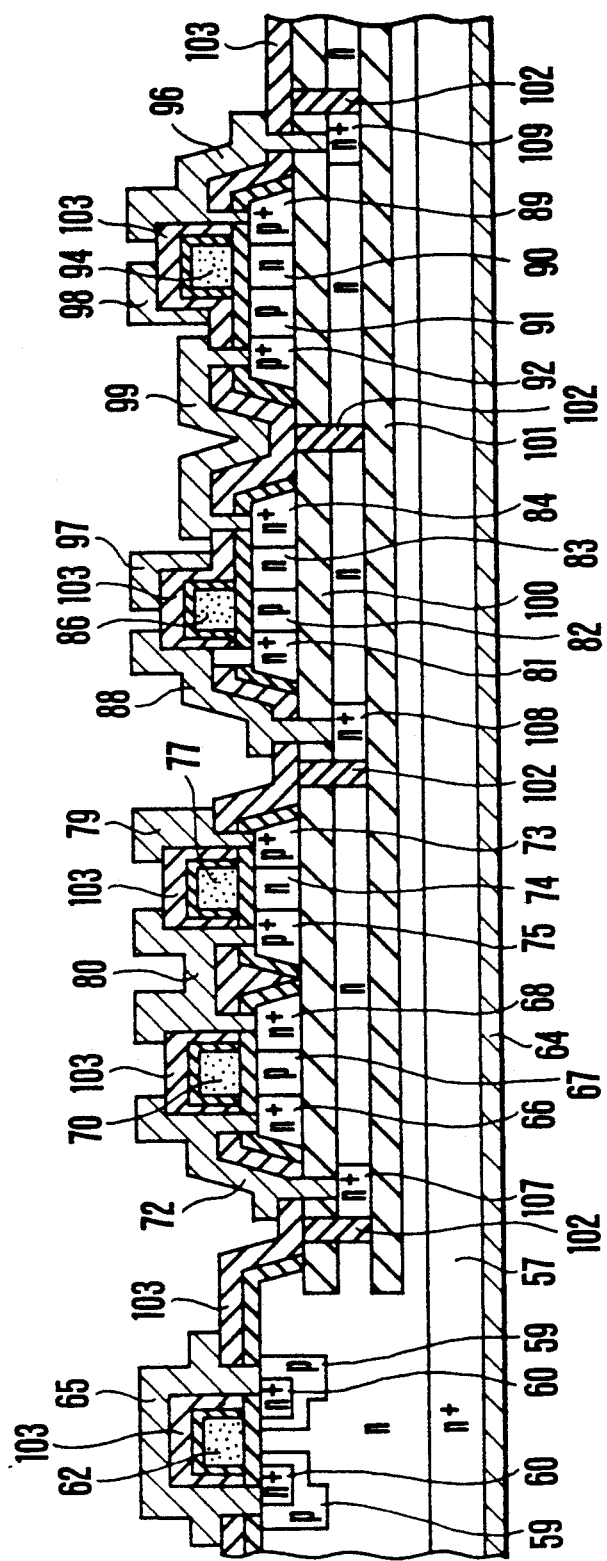

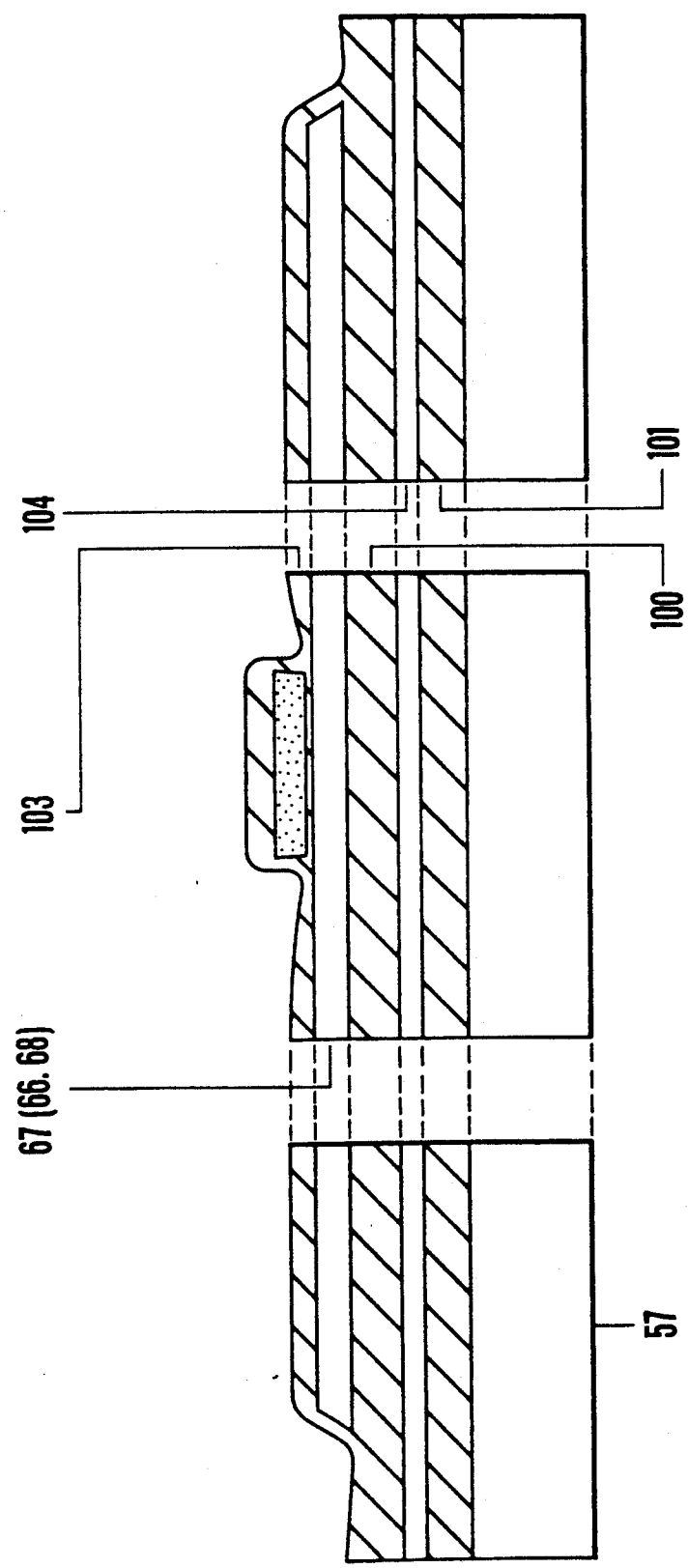

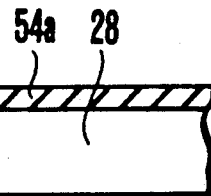
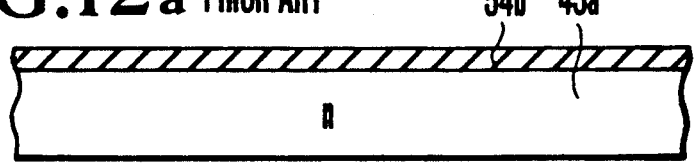
FIG.12a PRIOR ART
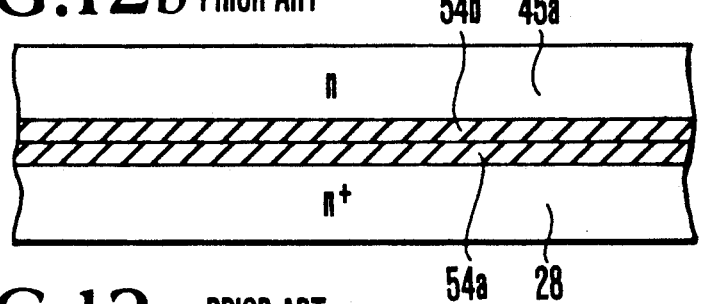
FIG.12b PRIOR ART
FIG.12c PRIOR ART
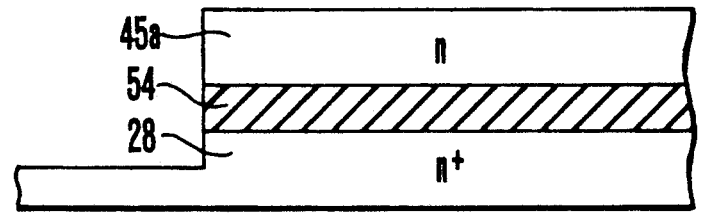
FIG.12d PRIOR ART
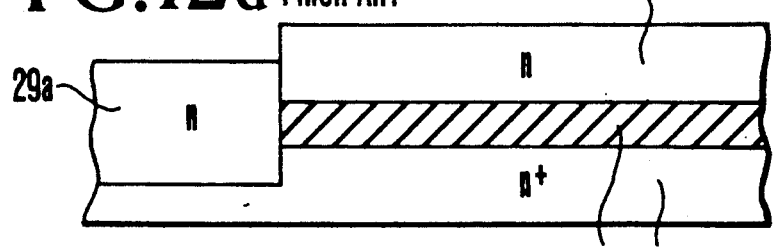
FIG.12e PRIOR ART

POWER SEMICONDUCTOR DEVICE

BACKGROUND OF THE INVENTION

The present invention relates to a power semiconductor device used as a high-voltage large-current device.

As a semiconductor device of this type, a device in which a power semiconductor component and a control semiconductor component for controlling driving of the power semiconductor component are integrated on a single semiconductor substrate has been mainly used along with recent developments in IC techniques.

FIGS. 10 and 11 show conventional power semiconductor devices of this type.

FIG. 10 shows a conventional power semiconductor device. Referring to FIG. 10, reference numeral 1 denotes an n-type crystalline Si (silicon) substrate with low resistivity; 2, 3, and 4, an n-type drain region, a p-type active region, and an n-type source region, respectively, of a high-voltage large-current vertical n-channel MIS (metal-insulator semiconductor) transistor; 5, 6, and 7, a gate-oxide film, a gate-electrode material, and a passivation-oxide film of the gate-electrode material, respectively, of the high-voltage large-current n-channel MIS transistor; 8 and 9, a source electrode and a drain electrode, respectively, of the high-voltage large-current n-channel MIS transistor; 10, 11, and 12, a p-type active region, an n-type source region, and an n-type drain region, respectively, of a low-voltage n-channel MIS transistor integrated to control the high-voltage large-current vertical n-channel MIS transistor; 13, 14, and 15, a gate-oxide film, a gate-electrode material, and a passivation-oxide film of the gate-electrode material, respectively, of the low-voltage n-channel MIS transistor; 16 and 17, a source electrode and a drain electrode, respectively, of the low-voltage n-channel MIS transistor; 18, 19, and 20, an n-type active region, a p-type source region, and a p-type drain region, respectively, of a low-voltage p-channel MIS transistor integrated to control the high-voltage large-current n-channel MIS transistor; 21, 22, and 23, a gate-oxide film, a gate-electrode material, and a passivation-oxide film of the gate-electrode material, respectively, of the low-voltage p-channel MIS transistor; 24 and 25, a source electrode and a drain electrode, respectively, of the low-voltage p-channel MIS transistor; 26, a p-type isolation region for electrically isolating the control low-voltage n-channel and p-channel MIS transistors from the high-voltage large-current vertical n-channel MIS transistor; and 27, an isolation-oxide film for electrically isolating the individual transistors. In power transistor configuration of the type shown in FIG. 10 and 11, the output of the control stage is coupled to the gate of the power transistor. The semiconductor device having the above arrangement is disclosed in, e.g., a known literature (1987 IEEE International Electron Devices Meeting [C. Contiero et al., "Design of A High Side Driver in Multipower-BCD and Vipower Technologies.," 1987 IEEE IEDM Technical Digest, p-p. 766-769]).

The above semiconductor device, however, has the following two drawbacks.

First, when the high-voltage large-current vertical n-channel MIS transistor is driven and the drain region 2 operates in a low-voltage linear region, a parasitic PNPN component is formed through, e.g., a path of p-type source region 19 → n-type active region 18 → p-type isolation region 26 → n-type drain region 2 → n-type source region 4, and an abnormal current caused by latch-up flows. A parasitic PNPN component is also formed through a path of p-type source region 19 → n-type active region 18 → p-type active region 10 → n-type source region 11 and driven in from off-state to on-state by an external noise pulse, thereby causing so-called latch-up. For this reason, an abnormal large-current flows through the above path. In this case, the current flowing through the former PNPN component is an abnormal current generated between the control low-voltage p-channel MIS transistor and the high-voltage large-current n-channel MIS transistor, and the current flowing through the latter PNPN component is an abnormal current generated between the control low-voltage p-channel MIS transistor and the control low-voltage n-channel MIS transistor. These abnormal currents cannot be eliminated unless a supply voltage to the semiconductor device is stopped. If the abnormal currents are allowed to flow, they result in permanent loss of circuit function of the semiconductor device.

In addition, the high-voltage large-current vertical n-channel MIS transistor and the control low-voltage n- and p-channel MIS transistors are isolated by a PN junction formed by the p-type isolation region 26 and the n-type drain region 2. Since an isolation voltage realized by this junction is at most 200 V, a voltage which can be applied to the drain electrode 9 of the high-voltage large-current n-channel MIS transistor is limited to 200 V. That is, in the semiconductor device having the arrangement shown in FIG. 10, it is difficult to integrate a high-voltage large-current vertical n-channel MIS transistor having a voltage exceeding 200 V.

In order to eliminate the above drawbacks, a semiconductor device has been proposed in which control low-voltage n- and p-channel MIS transistors and a high-voltage large-current vertical n-channel MIS transistor are isolated by a thick insulating film so that an isolation voltage between each two transistors is improved and no parasitic PNPN component is formed between the two transistors.

FIG. 11 shows a semiconductor device for eliminating the above drawbacks. Referring to FIG. 11, reference numeral 28 denotes an n-type crystalline Si substrate with low resistivity; 29, 30, and 31, an n-type drain region, a p-type active region, and an n-type source region, respectively, of a high-voltage large-current vertical n-channel MIS transistor; 32, 33, and 34, a gate-oxide film, a gate-electrode material, and a passivation-oxide film of the gate-electrode material, respectively, of the high-voltage large-current vertical n-channel MIS transistor; 35 and 36, a drain electrode and a source electrode, respectively, of the high-voltage large-current vertical n-channel MIS transistor; 37, 38, and 39, a p-type active region, an n-type source region, and an n-type drain region, respectively, of a low-voltage n-channel MIS transistor integrated to control the high-voltage large-current n-channel MIS transistor; 40, 41, and 42, a gate-oxide film, a gate-electrode material, and a passivation-oxide film of the gate-electrode material, respectively, of the low-voltage n-channel MIS transistor; 43 and 44, a source electrode and a drain electrode, respectively, of the low-voltage n-channel MIS transistor; 45, 46, and 47, an n-type active region, a p-type source region, and a p-type drain region, respectively, of a low-voltage p-channel MIS transistor integrated to control the high-voltage large-current n-channel MIS transistor; 48, 49, and 50, a gate-oxide film, a gate-electrode material, and a passivation-oxide film of the gate-electrode material, respectively, of the low-voltage p-channel MIS transistor; 51 and 52, a source electrode and a drain electrode, respectively, of the low-voltage p-channel MIS transistor; 53, 54, and 55, isolation-oxide films for dielectrically isolating the individual transistors; and 56, a polycrystalline Si layer, buried between the isolation-oxide films 55, for realization of a planar surface.

The semiconductor device having the above arrangement is disclosed in, e.g., a known literature (1987 IEEE Custom Integrated Circuits Conference [Y. Ohata et al., "Dielectrically Isolated Intelligent Power Switch," Proceedings of the IEEE 1987 Custom Integrated Circuits Conference, p-p. 443–446]).

FIGS. 12a to 12g show a method of manufacturing the semiconductor device shown in FIG. 11. This method will be described below with reference to FIGS. 12a to 12g. As shown in FIG. 12a, an oxide film 54a is formed on the surface of an n-type crystalline Si substrate 28 with low resistivity. As shown in FIG. 12b, an oxide film 54b is formed on the surface of an n-type crystalline Si substrate 45a. Thereafter, as shown in FIG. 12c, the oxide films 54a and 54b are brought into contact with each other and heated up to a high temperature to react with each other, thereby forming one oxide film 54. As shown in FIG. 12d, the n-type crystalline Si substrate 45a, the isolation-oxide film 54, and the n-type crystalline Si substrate 28 are partially removed by an RIE (Reactive Ion Etching) method. As shown in FIG. 12e, an n-type crystalline Si region 29a having a predetermined thickness is formed by epitaxial growth in a region removed by the RIE method. Subsequently, lapping and surface polishing are performed from the n-type crystalline silicon substrate 45a and the n-type crystalline Si region 29a to set a thickness T of the n-type crystalline Si substrate 45a to about 20 μm, thereby forming an n-type active region 45 of a low-voltage p-channel MIS transistor and an n-type drain region 29 of a high-voltage large-current n-channel MIS transistor. As shown in FIG. 12g, the n-type active region 45 is partially removed by the RIE method until the underlying isolation-oxide film 54 is exposed, thereby forming a trench. Inner walls of the trench are oxidized to form isolation-oxide films 55. Thereafter, for realization of a planar surface, a polycrystalline Si layer 56 is filled in a trench surrounded by the isolation-oxide films 54 and 55. Subsequently, a p-type active region 37 of a low-voltage n-channel MIS transistor is formed. A high-voltage large-current n-channel MIS transistor is formed in the n-type drain region 29, and control low-voltage n- and p-channel MIS transistors are formed in the p- and n-type active regions 37 and 45, respectively, thereby completing the semiconductor device shown in FIG. 11.

According to the semiconductor device shown in FIG. 11, the high-voltage large-current n-channel MIS transistor and the control low-voltage n- and p-channel MIS transistors are isolated dielectrically by the isolation-oxide films 54 and 55. Therefore, latch-up through the path of p-type source region 19 → n-type active region 18 → p-type isolation region 26 → n-type drain region 2 → n-type source region 4, which is problematic in the semiconductor device shown in FIG. 10, can be eliminated.

In addition, by sufficiently increasing the thickness of the isolation-oxide films 54 and 55, an isolation voltage exceeding 200 V, which cannot be realized by junction isolation, can be easily achieved. Therefore, a high-voltage large-current n-channel MIS transistor with a voltage exceeding 200 V can be integrated.

In the conventional semiconductor device having the arrangement shown in FIG. 11, however, the low-voltage n-channel MIS transistor and the low-voltage p-channel MIS transistor are isolated by the PN junction constituted by the p-type active region 37 and the n-type active region 45. Therefore, for example, a parasitic PNPN component is formed through a path of p-type source region 46 → n-type active region 45 → p-type active region 37 → n-type source region 38. That is, the above problem of latch-up is not completely solved. In order to disconnect this path, the low-voltage n- and p-channel MIS transistors must be completely isolated from each other by an insulating film such as an oxide film. In order to achieve this isolation, the boundary region between the n-type active region 45 and the p-type active region 37 must be removed by the RIE method to form a trench and an insulating film must be filled in the trench, as in the method of forming the isolation-oxide film 55 described with reference to FIG. 12g. As described above with reference to FIG. 12f, however, the n-type active region 45 is thick, i.e., has a thickness of about 20 μm. Therefore, in order to form a trench having a depth of 20 μm, the trench must be widened to have a width of about 8 μm. For this reason, if the low-voltage n- and p-channel MIS transistors are isolated by an insulating film, these MIS transistors cannot be integrated at high packing density. On the contrary, it can be easily assumed that in order to achieve a high packing density, the thickness of the n-type active region 45 can be further decreased to decrease the depth of the trench, thereby narrowing the isolation region. As described above with reference to FIG. 12f, however, the thickness of the n-type active region 45 is adjusted by lapping and surface polishing. Therefore, since a lapping and surface polishing precision is limited, it is difficult to control the thickness of the n-type active region 45 to several μm or less throughout the entire surface of, e.g., a 4-inch diameter semiconductor substrate.

The above conventional drawbacks can be summarized as follows.

(i) In the conventional arrangement shown in FIG. 10, all of the high-voltage large-current n-channel MIS transistor and the control low-voltage n- and p-channel MIS transistors are isolated by the PN junction. Therefore, parasitic PNPN components are formed between the high-voltage large-current n-channel MIS transistor and the control low-voltage p-channel MIS transistor and between the control low-voltage n-channel MIS transistor and the control low-voltage p-channel MIS transistor, respectively, thereby producing latch-up. In addition, since the isolation voltage of the PN junction is limited, a high-voltage large-current n-channel MIS transistor with a voltage exceeding 200 V cannot be integrated.

(ii) In the conventional arrangement shown in FIG. 11, a parasitic PNPN component is formed between the control low-voltage n-channel MIS transistor and the control low-voltage p-channel MIS transistor, thereby causing latch-up. In order to suppress this latch-up and integrate the control low-voltage n- and p-channel MIS transistors at high packing density, the thicknesses of the p-type active region 37 and the n-type active region 45 constituting the low-voltage n- and p-channel MIS transistors need only be decreased. Since, however, the thicknesses of these active regions are adjusted by lapping and surface polishing, it is difficult to form thin layers.

SUMMARY OF THE INVENTION

It is, therefore, a principal object of the present invention to provide a power semiconductor device with a high reliability which can prevent a latch-up phenomenon caused by charge coupling between a drain region of a high-voltage large-current vertical MIS transistor and a transistor formed on the same semiconductor substrate in order to drive the vertical MIS transistor, thereby preventing an abnormal current from flowing.

It is another object of the present invention to provide a power semiconductor device which has an effect of the above object and can prevent other regions of each component from being coupled to cause a latch-up phenomenon, thereby preventing an abnormal current from flowing.

It is still another object of the present invention to provide a power semiconductor device which can minimize a parasitic capacitance to increase an operation speed.

It is still another object of the present invention to provide a power semiconductor device with a high reliability which achieves a high packing density and causes no latch-up phenomenon.

In order to achieve the above objects of the present invention, there is provided a power semiconductor device comprising a layered first insulating region formed on a first major surface of a semiconductor layer, a first conductive layer formed on the first insulating region and having the same conductivity type as that of the semiconductor layer, a layered second insulating region formed on the first conductive layer, a vertical power transistor having the semiconductor layer as one of its components and formed on the first major surface of the semiconductor layer, a third insulating region for dielectrically isolating the first conductive layer from the other conductive layer, and a control MIS transistor, formed on the second insulating region, for controlling the vertical power transistor, wherein a predetermined bias is applied on the first conductive layer to prevent formation of a back channel of the control MIS transistor.

BRIEF DESCRIPTION OF THE DRAWINGS

FIGS. 2a to 2j are sectional views showing manufacturing steps of the semiconductor device shown in FIG. 1;

FIG. 3 is a sectional view showing in detail a sectional structure of a MIS transistor;

DETAILED DESCRIPTION OF THE PREFERRED EMBODIMENTS

Embodiments of the present invention will be described below with reference to the accompanying drawings.

Figure 1:
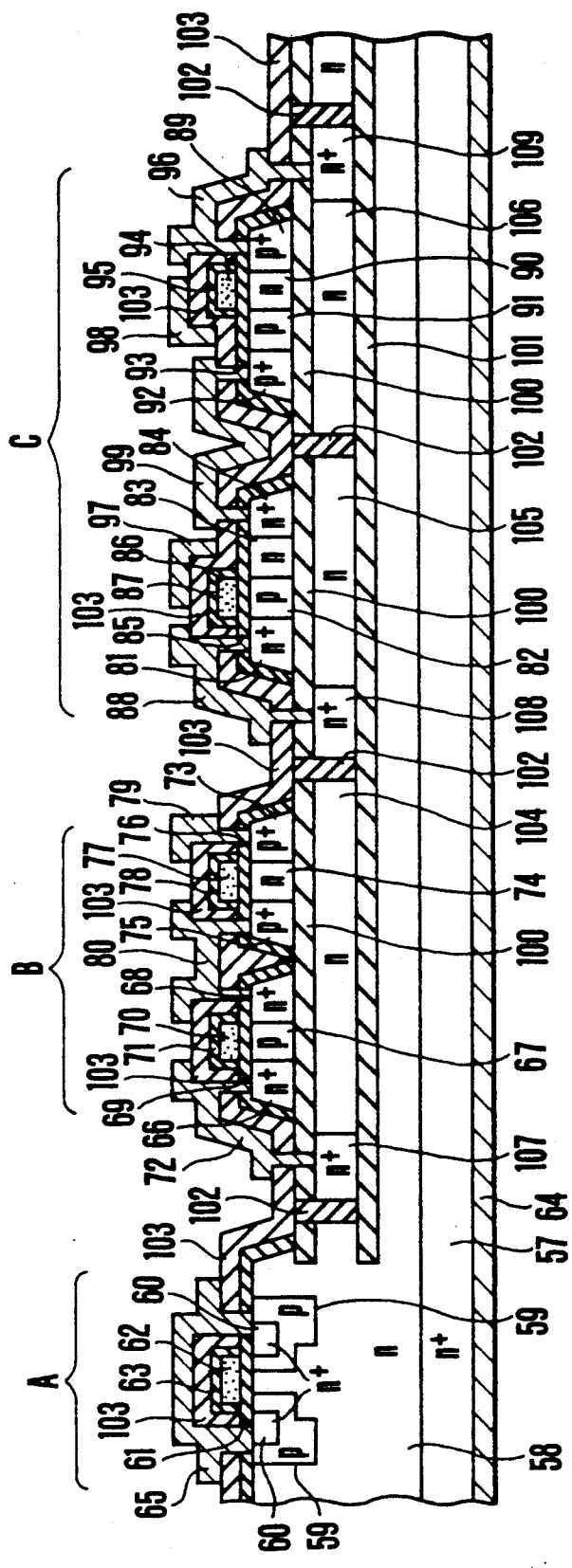
FIG. 1 is a sectional view of a semiconductor device according to the first embodiment of the present invention.

FIG. 1 shows the first embodiment of a power semiconductor device according to the present invention. In the first embodiment, a high-voltage large-current n-channel vertical power MIS transistor A and low- and medium-voltage complementary MIS inverters B and C are integrated on a single semiconductor chip. Referring to FIG. 1, reference numeral 57 denotes an n-type crystalline Si (silicon) substrate with low resistivity; 58, 59, and 60, an n-type drain region, a p-type active region, and an n-type source region, respectively, of the high-voltage large-current vertical n-channel MIS transistor A; 61, 62, and 63, a gate-oxide film, a gate-electrode material, and a passivation-oxide film of the gate-electrode material, respectively, of the high-voltage large-current vertical n-channel MIS transistor A; 64 and 65, a drain electrode and a source electrode, respectively, of the high-voltage large-current vertical n-channel MIS transistor A; 66, 67, and 68, an n-type source region, a p-type active region, and an n-type drain region, respectively, of a low-voltage n-channel MIS transistor B integrated in order to control the high-voltage large-current vertical n-channel MIS transistor A; 69, 70, 71, and 72, a gate-oxide film, a gate-electrode material, a passivation-oxide film of the gate-electrode material, and a source electrode, respectively, of the low-voltage n-channel MIS transistor B; 73, 74, and 75, a p-type source region, an n-type active region, and a p-type drain region, respectively, of a low-voltage p-channel MIS transistor B integrated in order to control the high-voltage large-current vertical n-channel MIS transistor A; 76, 77, 78, and 79, a gate-oxide film, a gate-electrode material, a passivation-oxide film of the gate-electrode material, and a source electrode, respectively, of the low-voltage p-channel MIS transistor B; and 80, an electrode for connecting the n-type drain region 68 to the p-type drain region 75. Reference numerals 81, 82, 83, and 84 denote an n-type source region, a p-type active region, an n-type offset-gate region, and an n-type drain region, respectively, of a medium-voltage n-channel MIS transistor C integrated in order to control the high-voltage vertical n-channel MIS transistor A; 85, 86, 87, and 88, a gate-oxide film, a gate-electrode material, a passivation-oxide film of the gate-electrode material, and a source electrode, respectively, of the medium-voltage n-channel MIS transistor C; 89, 90, 91, and 92, a p-type source region, an n-type active region, a p-type offset-gate region, and a p-type drain region, respectively, of the medium-voltage p-channel MIS transistor C; 93, 94, 95, and 96, a gate-oxide film, a gate-electrode material, a passivation-oxide film of the gate-electrode material, and a source electrode, respectively, of the medium-voltage p-channel MIS transistor C; 97 and 98, field-plate electrodes connected to the gate-electrode materials 86 and 94, respectively; and 99, an electrode for connecting the n-type drain region 84 to the p-type drain region 92. Reference numerals 100, 101, and 102 denote isolation-oxide films for dielectrically isolating the individual MIS transistors; 103, a surface passivation-oxide film; and 104, an n-type crystalline Si layer serving as a back-gate electrode of the low-voltage n- and p-channel MIS transistors B. The low-voltage n- and p-channel MIS transistors B are arranged immediately above the n-type crystalline Si layer 104. Reference numeral 105 denotes an n-type crystalline Si layer serving as a back-gate electrode of the medium-voltage n-channel MIS transistor C; and 106, an n-type crystalline Si layer serving as a back-gate electrode of the medium-voltage p-channel MIS transistor C. The medium-voltage n- and p-channel MIS transistors are arranged immediately above the n-type crystalline Si layers 105 and 106, respectively. Reference numerals 107, 108, and 109 denote n-type crystalline Si layers with a high impurity concentration for connecting the n-type crystalline Si layer 104 to the source electrode 72, the n-type crystalline Si layer 105 to the source electrode 88, and the n-type crystalline Si layer 106 to the source electrode 96, respectively, at the same potential.

FIGS. 2a to 2j show manufacturing steps of the semiconductor device shown in FIG. 1. The description will be made in accordance with an order of the manufacturing steps hereinafter.

(a) (FIG. 2a) An n-type crystalline Si layer 58a is formed by epitaxial growth on the first major surface side of the n-type crystalline Si substrate 57 with low resistivity having a (100) plane. Thereafter, a silicon-oxide ($SiO_2$) film 90a having a thickness of about 1 $\mu$m is formed on a part of the surface of the n-type crystalline Si layer 58a. An oxygen ion is implanted by using the $SiO_2$ film 90a as a mask, and high-temperature annealing is performed to selectively form the isolation-oxide film 101 inside the n-type crystalline Si layer 58a. In this case, an oxygen ion is implanted with a dose of $2 \times 10^{18}$ cm$^{-2}$ at 180 KeV, and the resultant structure is annealed at 1150° C. for 2 h. As a result, the film thickness of the isolation-oxide film 101 becomes about 0.43 $\mu$m. At this time, the thickness of the n-type crystalline Si layer located immediately above the isolation-oxide film 101 becomes about 0.15 $\mu$m.

(b) (FIG. 2b) After the $SiO_2$ film 90a is removed by etching, an n-type crystalline Si layer 58b having the same impurity concentration as the n-type crystalline Si layer 58a is formed by epitaxial growth to have a thickness of about 0.5 $\mu$m.

(c) (FIG. 2c) An $SiO_2$ film 90b is formed again on the n-type crystalline Si layer 58b by the same method as the formation method of the $SiO_2$ film 90a. Thereafter, an oxygen ion is implanted with a dose of $2.2 \times 10^{18}$ cm$^{-2}$ at 180 KeV, and the resultant structure is annealed at 1150° C. for 2 h, thereby selectively forming the isolation-oxide film 100 inside the n-type crystalline Si layer 58b. The thickness of the isolation oxide film 100 becomes about 0.47 $\mu$m.

(d) (FIG. 2d) After the $SiO_2$ film 90b is removed by etching, an n-type crystalline Si layer 58c having the same impurity concentration as the n-type crystalline Si layer 58a is formed by epitaxial growth so that the thickness of the entire n-type crystalline Si layer located immediately above the isolation-oxide film 100 becomes 0.4 $\mu$m.

(e) (FIG. 2e) Boron and phosphorus ions are implanted in a predetermined region of the n-type crystalline Si layer 58c with a predetermined dose, and high-temperature annealing is performed, thereby forming the p-type active regions 67 and 82 of the low- and medium-voltage n-channel MIS transistors, respectively, and the n-type active regions 74 and 90 of the low- and medium-voltage p-channel MIS transistors, respectively. Thereafter, an $SiO_2$ film 110 and a silicon-nitride ($Si_3N_4$) film 111 are sequentially formed. The n-type crystalline Si layers 58a, 58b, and 58c in a region in which the isolation-oxide films 100 and 101 are not formed serve as the drain region 58 of the high-voltage large-current n-channel MIS transistor.

(f) (FIG. 2f) After the $Si_3N_4$ film 111 and the $SiO_2$ film 110 are patterned into a desired shape, the exposed n-type drain region 58, p-type active regions 67 and 82, and n-type active regions 74 and 90 are anisotropically etched by a diluted KOH solution, thereby forming a crystalline-Si island on the isolation-oxide film 100. At this time, a (111) plane is obtained on the side surface of the crystallineSi island. Thereafter, selective oxidation is performed by using the $Si_3N_4$ film 111 and the isolation-oxide film 100 as masks, thereby forming an $SiO_2$ film 112 thicker than the $SiO_2$ film 110 on the side surfaces.

(g) (FIG. 2g) The $Si_3N_4$ film 111 and the $SiO_2$ film 110 are sequentially removed to expose only the upper surfaces of the crystalline Si island and the n-type drain region 58, and then the upper surfaces are oxidized to form the gate-oxide films 61, 69, 76, 85, and 93 having a film thickness of, e.g., 50 $\mu$m. When the $SiO_2$ film 110 is removed, the $SiO_2$ film 112 remains on the side surfaces. Therefore, the gate-oxide film on the side surface is thicker than that on the upper surface. Subsequently, the gate-electrode materials 62, 70, 77, 86, and 94 are formed by deposition of a polycrystalline Si layer and patterning by the RIE method.

(h) (FIG. 2h) After the surfaces of the gate-electrode materials 62, 70, 77, 86, and 94 are oxidized to from the passivation-oxide films 63, 71, 78, 87, and 95, respectively, an $Si_3N_4$ film 113 is deposited. Subsequently, the $Si_3N_4$ film 113, the isolation-oxide film 100, and the n-type crystalline Si layers 104, 105, and 106 are partially removed by the RIE method as shown in FIG. 2h to form a trench 114.

Figure 2A:
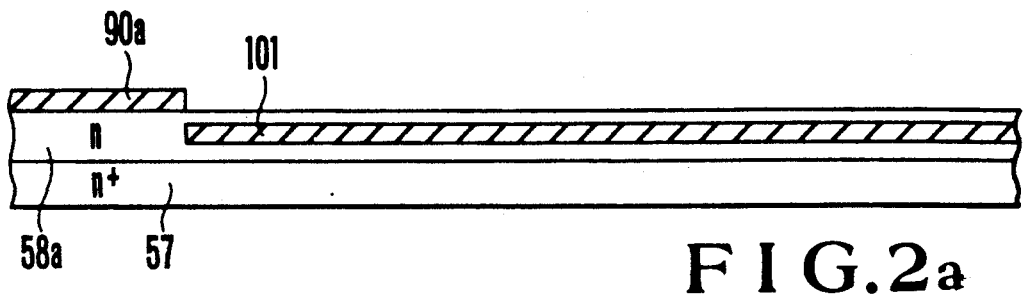
Figure 2B:
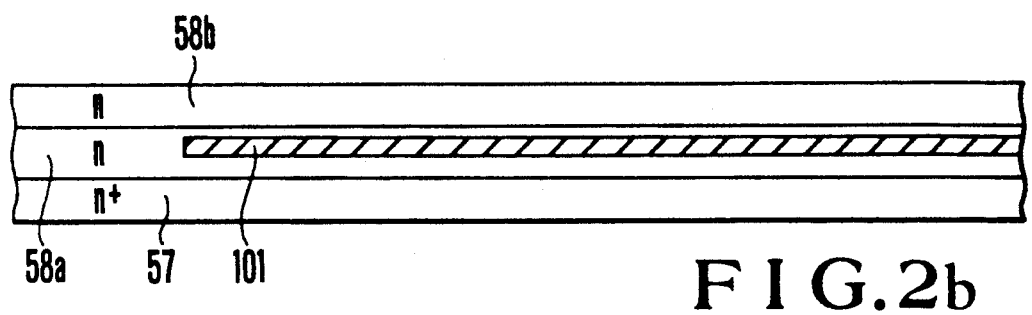
Figure 2C:
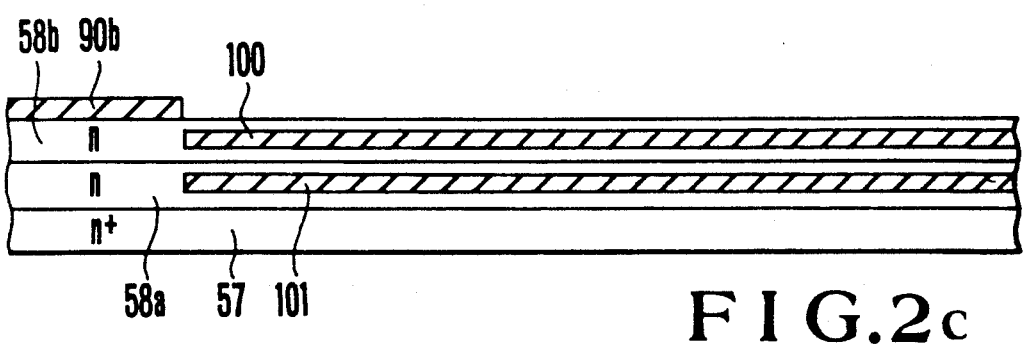
Figure 2D:
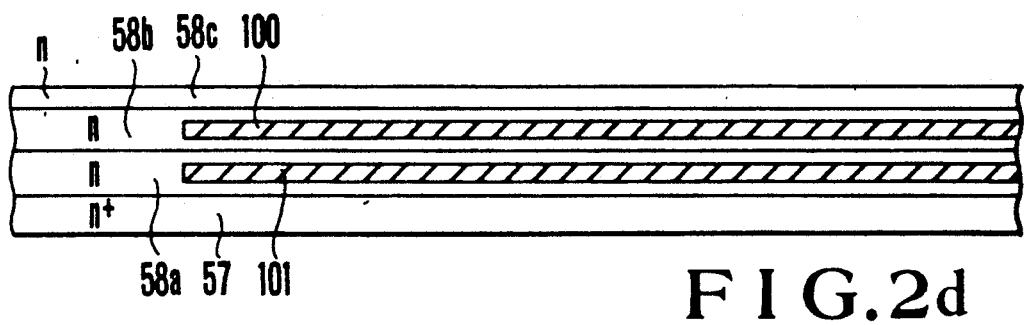
Figure 2E:
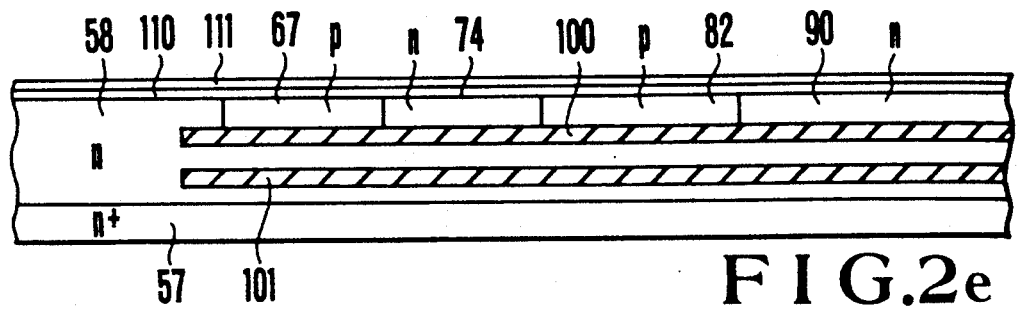
Figure 2F:
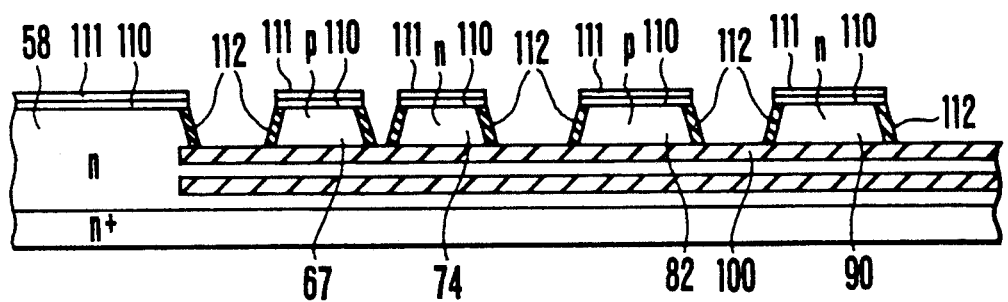
Figure 2G:
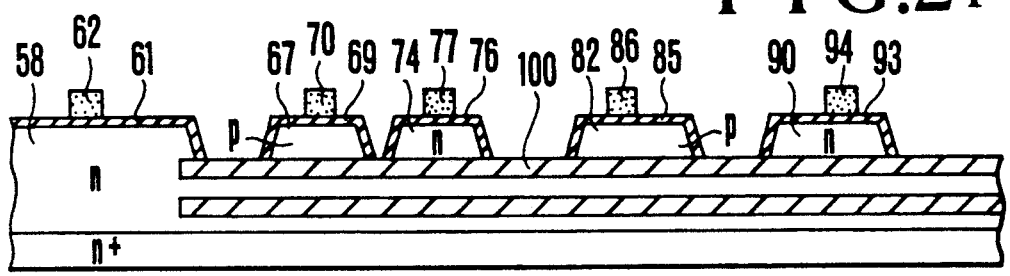
Figure 2H:
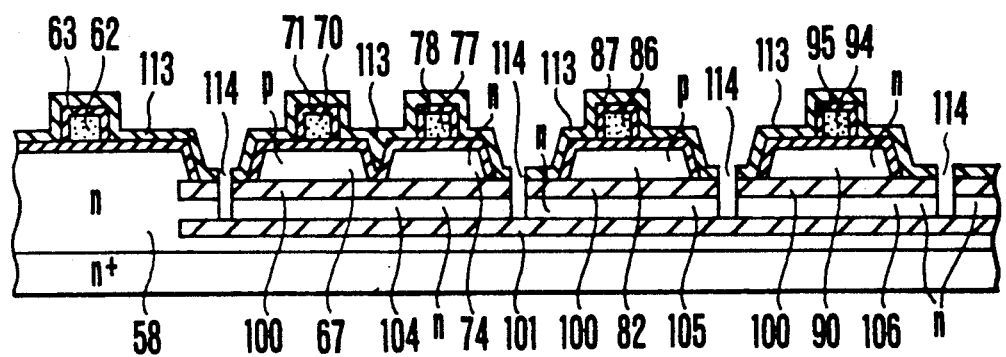
Figure 2I:
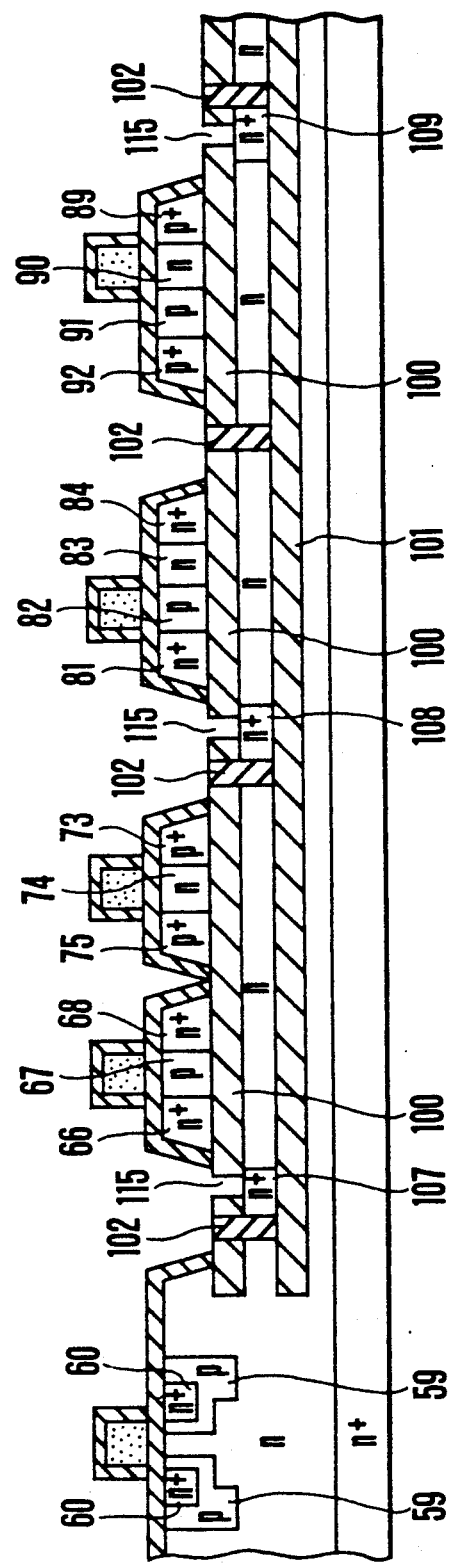

(i) (FIG. 2i) After the isolation-oxide film 102 is deposited in the trench 114 formed in the manufacturing step shown in FIG. 2h, the $Si_3N_4$ film 113 is removed by boiled phosphoric acid. Thereafter, the isolation-oxide film 100 is partially removed to from a contact window 115 as shown in FIG. 2i. Subsequently, a phosphorus or boron ion is implanted and then annealing is performed to form the n-type source region 60 and the p-type active region 59 of the high-voltage large-current vertical n-channel MIS transistor, the n-type source region 66 and the n-type drain region 68 of the low-voltage n-channel MIS transistor, and the p-type source region 73 and the p-type drain region 75 of the low-voltage p-channel MIS transistor. In addition, the n-type source region 81, the n-type offset-gate region 83, and the n-type drain region 84 of the medium-voltage n-channel MIS transistor, and the p-type source region 89, the p-type offset-gate region 91, and the p-type drain region 92 of the medium-voltage p-channel MIS transistor are formed. The n-type crystalline Si layers 107, 108, and 109 with a high impurity concentration are formed simultaneously with formation of the source and drain regions of the n-channel MIS transistor.

(j) (FIG. 2j) The surface passivation-oxide film 103 such as a PSG film is deposited. As a sectional structure of a device after the PSG film is deposited, a sectional view of a low-voltage n-channel MIS transistor is shown in FIG. 3. After PSG deposition, in order to apply a potential to the n-type crystalline Si layers (107, 108, and 109) with a high impurity concentration and components (59, 60, 66, 68, 73, 75, 81, 84, 89, and 92) of MIS transistors, contact windows are formed as shown in FIG. 2j, thereby forming the source electrodes 65, 72, 79, 88, and 96 and the drain electrodes 80 and 99. In addition, the field-plate electrodes 97 and 98 are formed. The field-plate electrodes 97 and 98 are connected to the gate-electrode materials 86 and 94, respectively. An electrode is formed on the second major surface of the n-type crystalline Si substrate 57 with low resistivity to serve as the drain electrode 64 of the high-voltage large-current n-channel MIS transistor.

The structural features of the above semiconductor device will be described below.

(i) The low- and medium-voltage n- and p-channel MIS transistors normally operate without being adversely affected by the high-voltage large-current n-channel MIS transistor. This is because, as shown in FIG. 1, the potential of the n-type crystalline Si layers 104, 105, and 106 is always the same as the source potential of the low- and medium-voltage MIS transistors and a high voltage applied on the drain electrode 64 of the high-voltage large-current vertical n-channel MIS transistor is consumed by the isolation-oxide films 101 and 102. For this reason, even if a high voltage is applied on the drain electrode 64, the low- and medium-voltage n- and p-channel MIS transistors normally operate as long as the voltage does not exceed a breakdown voltage of the isolation-oxide films 101 and 102.

Figure 4:
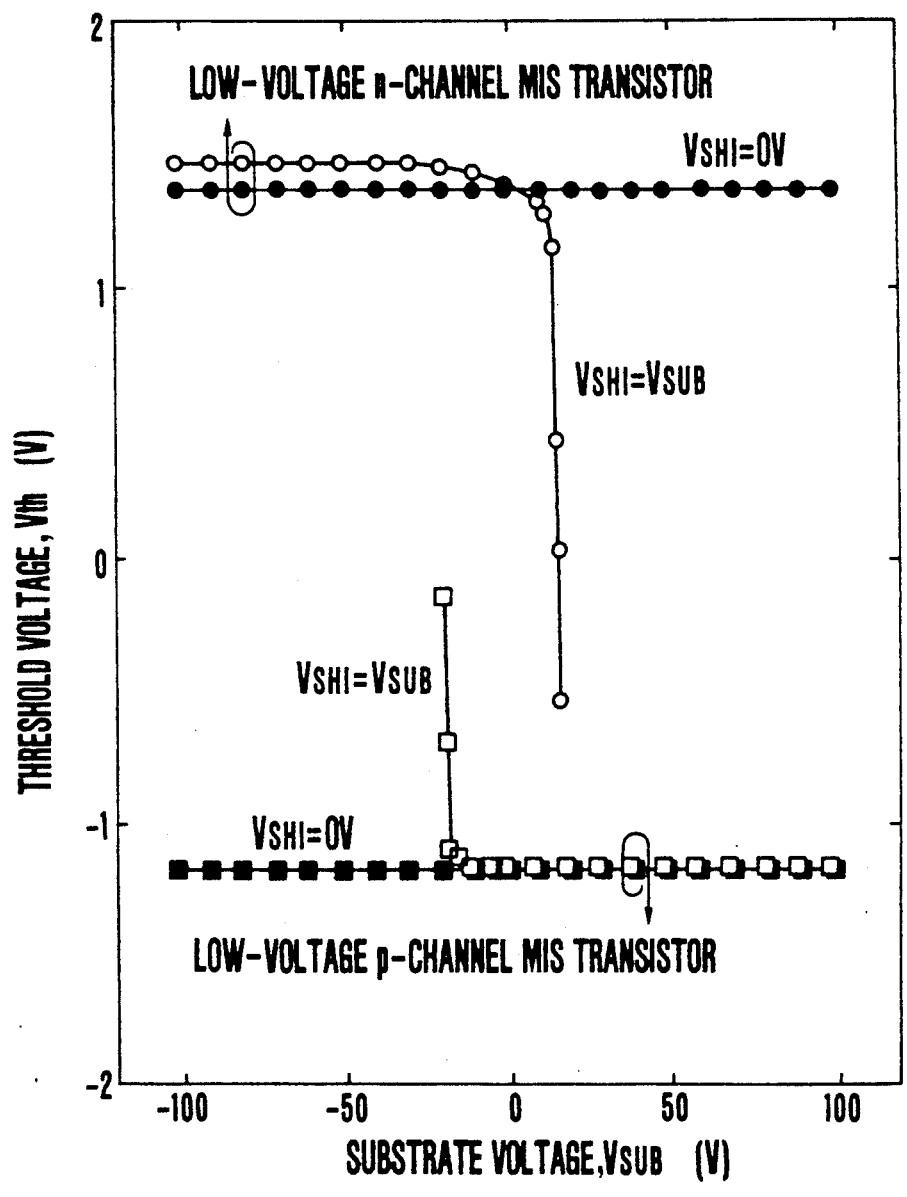
FIG. 4 is a graph showing a relationship between a threshold voltage and a substrate voltage of the MIS transistor.
Figure 5:
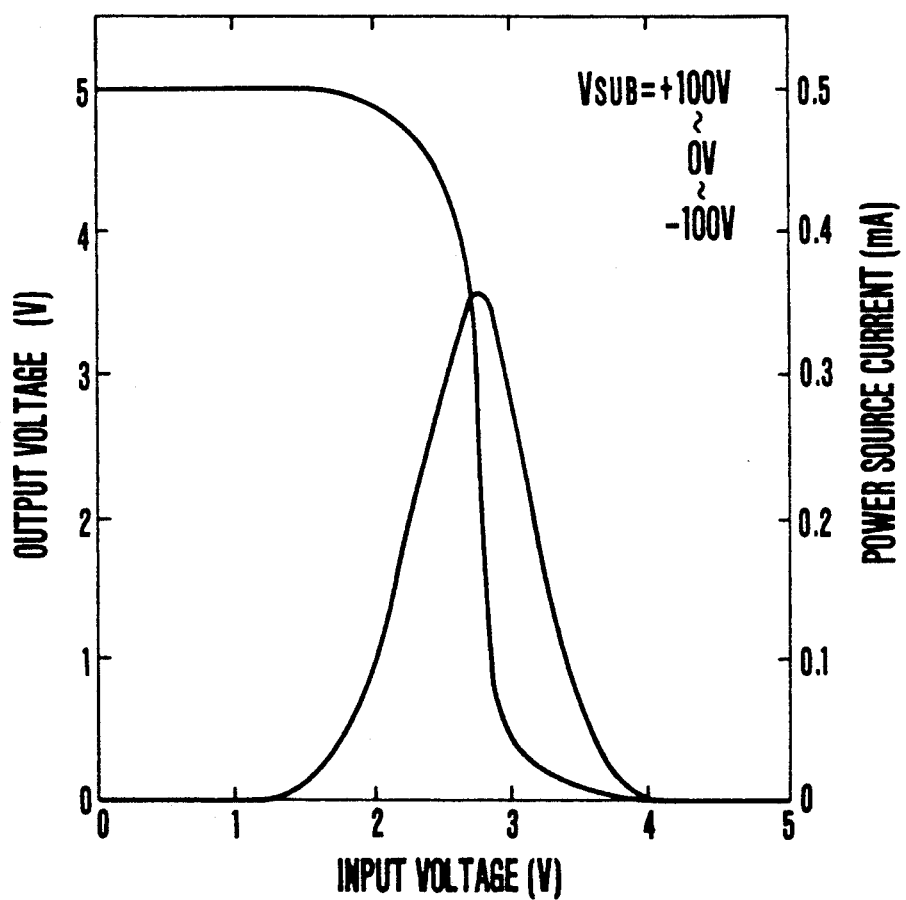
FIG. 5 is a graph showing a relationship between transfer characteristics and a substrate voltage of a complementary MIS inverter.

FIGS. 4 and 5 show experimental results which indicate that even if a drain voltage (a substrate voltage $V_{SUB}$ in FIGS. 4 and 5) of the high-voltage large-current vertical n-channel MIS transistor changes within the range of $-100$ V to $+100$ V, electrical characteristics of the low-voltage n- and p-channel MIS transistors do not change. FIG. 4 shows a substrate voltage dependency of a threshold voltage of each of the n- and p-channel MIS transistors. When a voltage ($V_{SHI}$ in FIG. 4) of the n-type crystalline Si layer 104 serving as a shielding layer is fixed at 0 V, the threshold voltages Vth of the n- and p-channel MIS transistors (corresponding to symbols    and    in FIG. 4, respectively) do not change even if $V_{SUB}$ changes within the range of $-100$ V to $+100$ V. If $V_{SHI}=V_{SUB}$, a shielding effect of the n-type crystalline Si layer 104 disappears. Therefore, an absolute value of $V_{SUB}$ is increased to generate a back channel. As a result, the sign of the threshold voltage (represented by symbol ○ in FIG. 4) of the n-channel MIS transistor changes from positive to negative, and the sign of the threshold voltage (represented by symbol □ in FIG. 4) of the p-channel MIS transistor changes from negative to positive. FIG. 5 shows a substrate voltage dependency of transfer characteristics of a complementary MIS inverter. Measurement was performed such that the potential of the n-type crystalline Si layer 104 was set at 0 V which was the same potential as the source of the n-channel MIS transistor. Since the n-type crystalline Si layer 104 serves as a shielding layer, the transfer characteristics do not change even if $V_{SUB}$ changes within the range of $-100$ V to $+100$ V.

Figure 6:
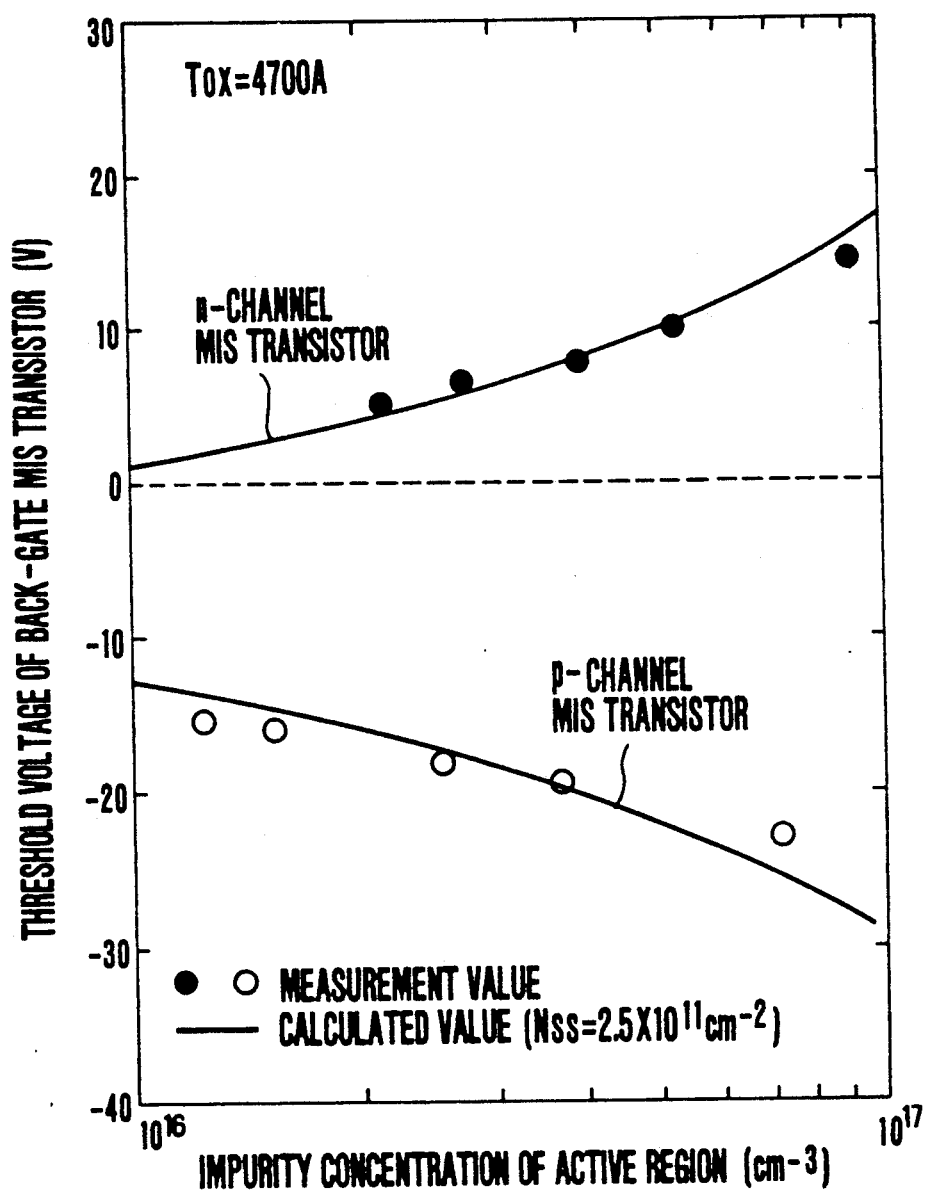
FIG. 6 is a graph showing a threshold voltage of a back-gate MIS transistor.

In the structure shown in FIG. 1, the n-type crystalline Si layers 104, 105, and 106 are not all set at the same potential, but the n-type crystalline Si layer 104 is set at the same potential as the source region 66 of the low-voltage n-channel MIS transistor formed to be perspectively covered by or included in a region of the layer 104, the n-type crystalline Si layer 105 is set at the same potential as the source region 81 of the medium-voltage n-channel MIS transistor formed to be perspectively covered by or included in a region of the layer 105, and the n-type crystalline Si layer 106 is set at the same potential as the source region 89 of the medium-voltage p-channel MIS transistor formed to be perspectively covered by or included in a region of the layer 106. The reason for this will be described below. The low-voltage complementary MIS inverter constituted by the low-voltage n- and p-channel MIS transistors will be described below. The two transistors constituting this low-voltage complementary MIS inverter are so arranged as to be perspectively covered by or included in a region of the n-type crystalline Si layer 104 located below. Assume that the source electrode 72 is at 0 V and the source electrode 79 is at 5 V. Since the n-type crystalline Si layer 104 is at 0 V, which is the same potential as the source region 66, the low-voltage n-channel MIS transistor normally operates. In the low-voltage p-channel MIS transistor, the potential of the n-type active region 74 is at substantially 5 V. Therefore, by an effect of a parasitic MIS capacitor having the isolation-oxide film 100 as a gate-oxide film, holes are induced at the n-type active region 74 side near an interface between the n-type active region 74 and the isolation-oxide film 100. When this hole density exceeds an electron density in the n-type active region 74, a back channel is formed. In order to form this back channel, however, the above potential, i.e., 5 V must be higher than the threshold voltage of the back-gate MIS transistor having the isolation-oxide film 100 as a gate-oxide film. FIG. 6 shows a relationship between the threshold voltage of the back-gate MIS transistor and an impurity concentration of the active region. Referring to FIG. 6, symbols    and ○ represent actual measurement values, and a solid curve represents a value calculated assuming that a fixed-charge density Nss of the isolation-oxide film 100 is $2.5 \times 10^{11}$ cm$^{-2}$. When an impurity concentration of the n-type active region 74 of the p-channel MIS transistor falls within the range of $10^{16}$ to $10^{17}$ cm$^{-3}$, the threshold voltage is between ten to twenty V or more. Since 5 V is much smaller than this threshold voltage, no back channel is formed. That is, in the low-voltage complementary MIS inverter which operates upon application of 5 V, electrical characteristics are not adversely affected at all even if the potential of the n-type crystalline Si layer 104 is set at 0 V. If, however, a voltage exceeding the above threshold voltage is applied on the complementary MIS inverter, a back channel is formed in the p-channel MIS transistor. Therefore, since the p-channel MIS transistor is set in a normally-on state, the complementary MIS inverter does not normally operate. In order to solve this problem, the structure is made such that at the side of the medium-voltage complementary MIS inverter constituted by the medium-voltage n- and p-channel MIS transistors, the n-type crystalline Si layer 105 and the n-type source region 81, and the n-type crystalline Si layer 106 and the p-type source region 89 are set at the same potentials, respectively. For this reason, even if a voltage exceeding the above threshold voltage is applied on the source electrode 96, no back channel is formed in the medium-voltage n- and p-channel MIS transistors, and the medium-voltage complementary MIS inverter exhibits normal electrical characteristics. In this case, the two transistors constituting the medium-voltage complementary MIS inverter are so formed and arranged as to be perspectively covered by or included in regions of the Si layers 105 and 106, respectively.

Note that it is also important that the n-type crystalline Si layers 104 and 105 have low resistivity. This is because when a high voltage is applied on the drain electrode 64 of the high-voltage large-current n-channel MIS transistor, a transient state is always present before a steady state in which the voltage is completely received by the isolation-oxide films 101 and 102 is obtained. In this transient state, since the applied voltage is received by the isolation-oxide film 101 and the n-type crystalline Si layers 104, 105, and 106, the potentials of these above n-type crystalline Si layers are temporarily increased. As a result, a back channel is generated in, e.g., the n-channel MIS transistor. In order to prevent an erroneous operation, the film thickness of the isolation-oxide films 100 and 101 need only be increased or the resistivity of the n-type crystalline Si layers 104, 105, and 106 need only be decreased.

(ii) Since all the transistors are completely isolated from each other by the insulating film, no parasitic PNPN component is formed to cause latch-up.

(iii) Since each of the low- and medium-voltage control transistors is a lateral type MIS transistor, components constituting the transistor can be aligned adjacent to each other on the insulating layer. As a result, a parasitic capacitance can be decreased to increase an operation speed. In addition, since the thickness of the above-described components can be decreased, a power semiconductor device can be manufactured with a high packing density.

Characteristic features of the manufacturing method of the embodiment described above will be described below.

(i) The thickness of the crystalline Si islands located on the isolation-oxide film can be easily decreased to 0.4 m or less. Therefore, these crystalline Si islands can be easily isolated laterally, and an isolation region can be narrowed. For this reason, the bottom surfaces of the source and drain regions of the low- and medium-voltage n- and p-channel MIS transistors formed in the crystalline Si islands can be easily formed to reach the underlying isolation-oxide film. Therefore, an effective area of the PN junction formed by the source and drain can be largely decreased to reduce a parasitic capacitance, thereby achieving a high-speed operation.

(ii) The high-voltage large-current vertical n-channel MIS transistor is formed on a crystalline semiconductor layer epitaxially grown on a high-quality crystalline semiconductor substrate upon start of the manufacture. Therefore, electrical characteristics are not degraded when a complementary MIS inverter is integrated on the same substrate.

Note that the embodiment shown in FIG. 1 adopts an n-channel DMOSFET (Double-diffused MOSFET) as a high-voltage large-current MIS transistor structure. The same effects, however, can be obtained by adopting an n-channel RMOSFET (Rectangular-grooved MOSFET), also-called a UMOSFET (U-grooved MOSFET), or an IGBT (Insulated Gate Bipolar Transistor). Of these high-voltage large-current vertical MIS transistors, the RMOSFET structure is disclosed in, e.g., a known literature (IEEE transactions on Electron Devices [D. Ueda et al., "An Ultra-Low On-Resistance Power MOSFET Fabricated by Using a Fully Self-Aligned Process," IEEE Transactions on Electron Devices, Vol. ED-34, No. 4, p-p. 926–930, 1978]).

The IGBT structure is disclosed in, e.g., a known literature (IEEE Electron Device Letters [B. J. Baliga, "Fast-Switching Insulated Gate Transistors," IEEE Electron Device Letters, Vol. EDL-4, No. 12, p-p. 452–454, 1983]).

Figure 7:
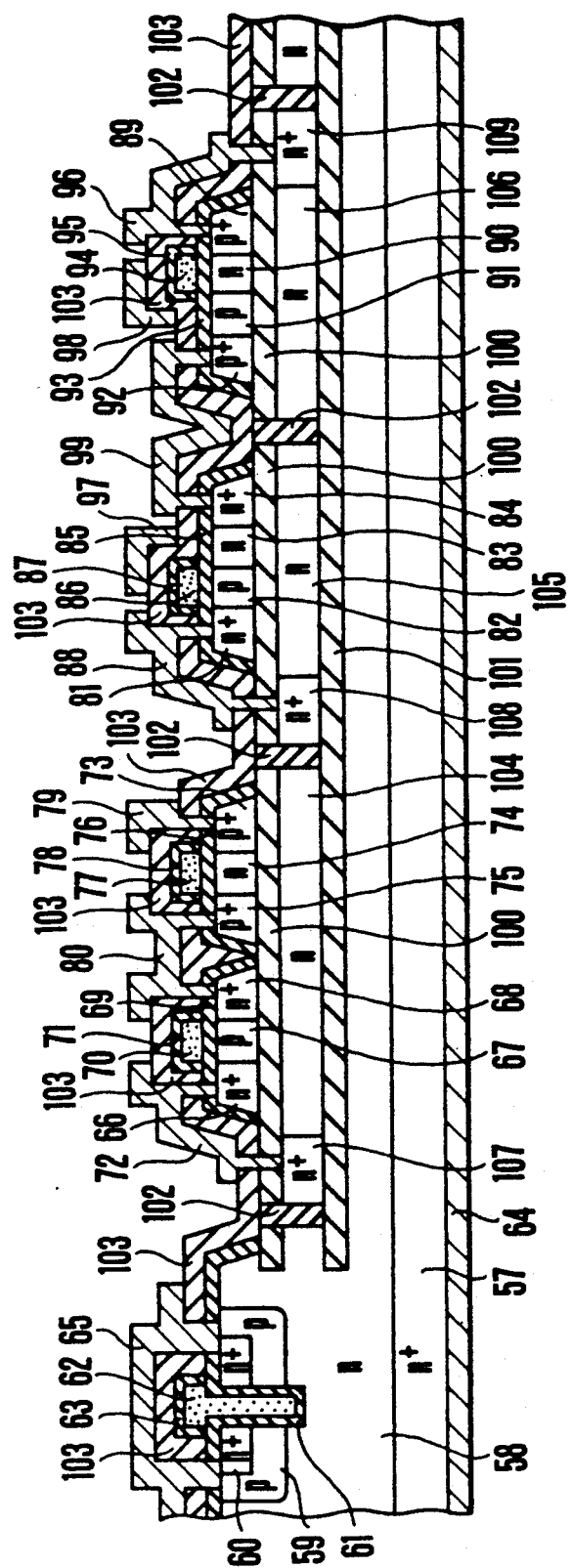
FIG. 7 is a sectional view of a semiconductor device according to the second embodiment of the present invention.

FIG. 7 shows the second embodiment of the present invention, in which an RMOSFET and a complementary MIS inverter are integrated on a single chip. A structural difference between the DMOSFET shown in FIG. 1 and the RMOSFET shown in FIG. 7 lies in a gate structure. That is, a gate is formed on a substrate surface in the former structure, while a gate is formed in a U-groove formed in a substrate in the latter structure. Note that portions shown in FIG. 7 have the same names as the corresponding portions shown in FIG. 1.

Figure 8:
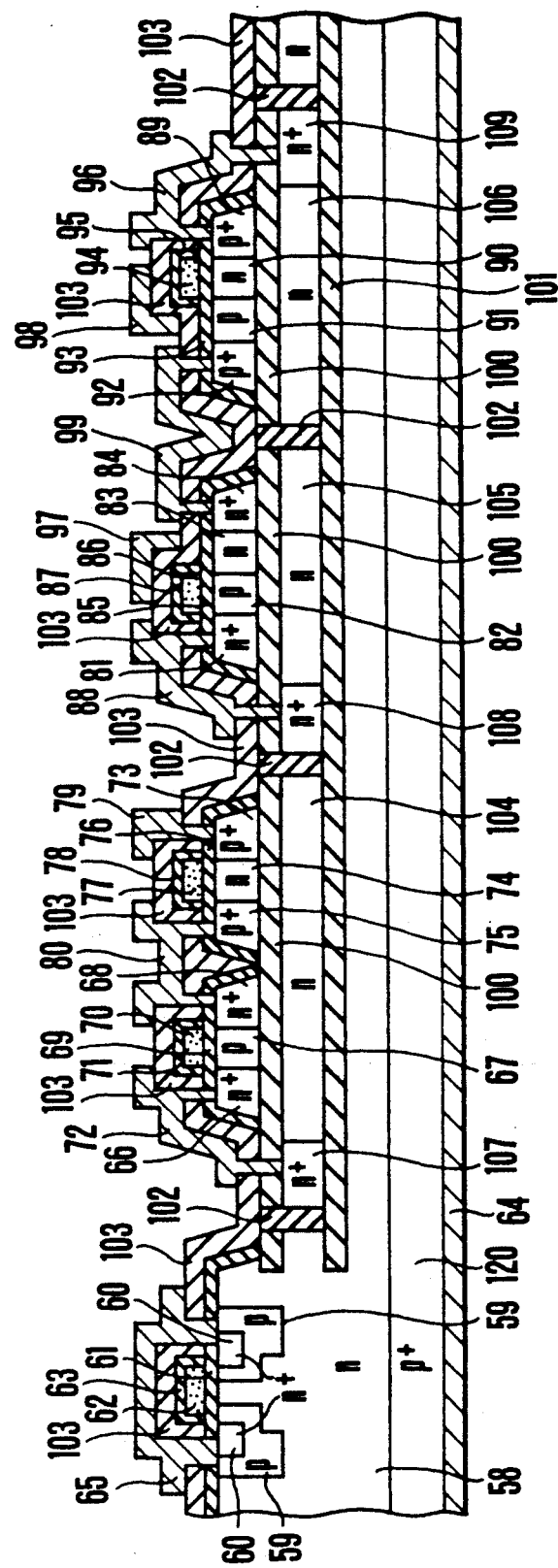
FIGS. 8 and 9 are sectional views of semiconductor devices according to the third and fourth embodiments of the present invention, respectively.

FIG. 8 shows the third embodiment of the present invention, in which an IGBT and a complementary MIS inverter are integrated on a single chip. A structural difference between the DMOSFET shown in FIG. 1 and the IGBT shown in FIG. 8 lies in a conductivity type of a crystalline Si substrate with low resistivity. That is, the Si substrate 57 is of an n-type in the DMOSFET, while an Si substrate 120 is of a p-type in the IGBT. Note that in the IGBT, the names of the n-type drain region 58, the p-type active region 59, the n-type source region 60, the drain electrode 64, and the source electrode 65 are changed to an n-type drift region 58, a p-type base region 59, an n-type emitter region 60, a collector electrode 64, and an emitter electrode 65, respectively. Portions of low- and medium-voltage complementary MIS inverters and portions of an isolation region have the same names as the corresponding portions shown in FIG. 1.

Figure 9:
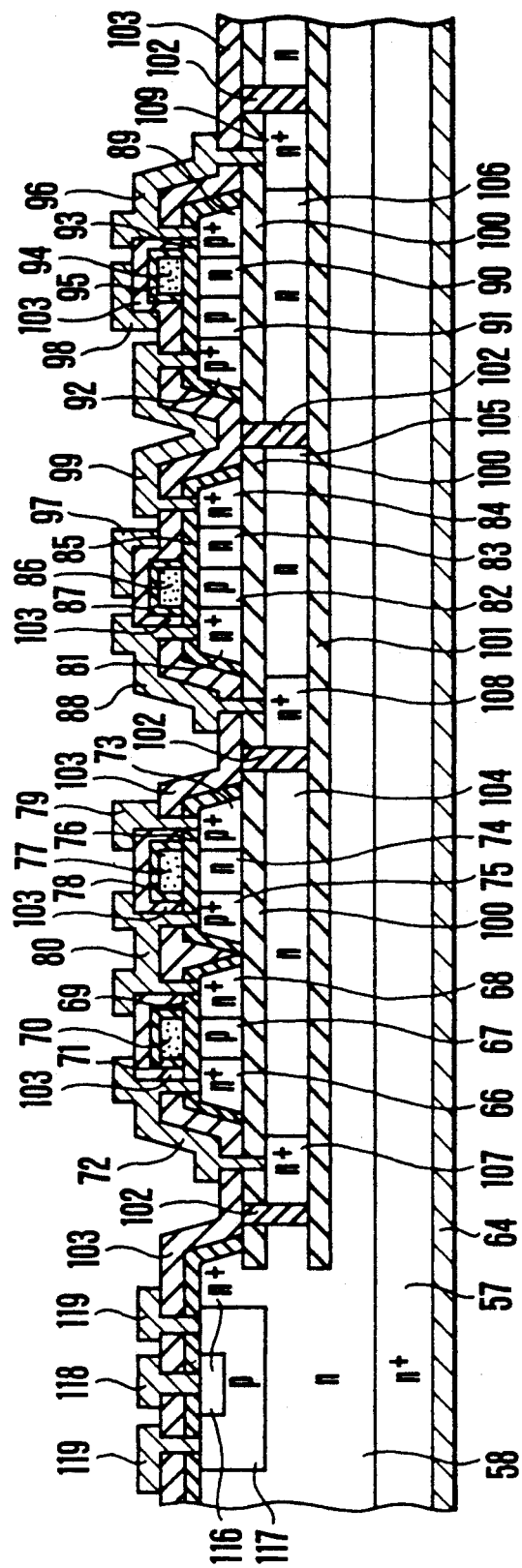
Figure 10:
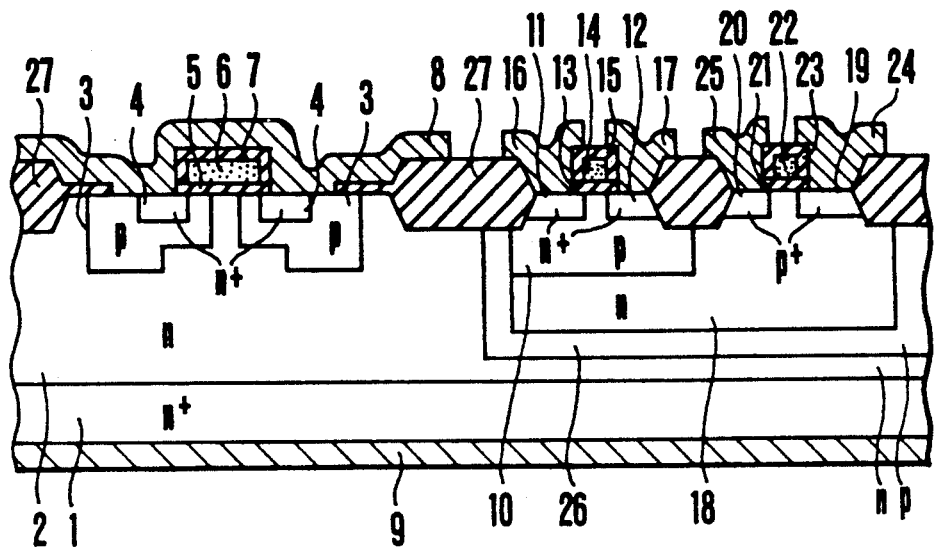
FIGS. 10 and 11 are sectional views of conventional semiconductor devices, respectively.
Figure 11:
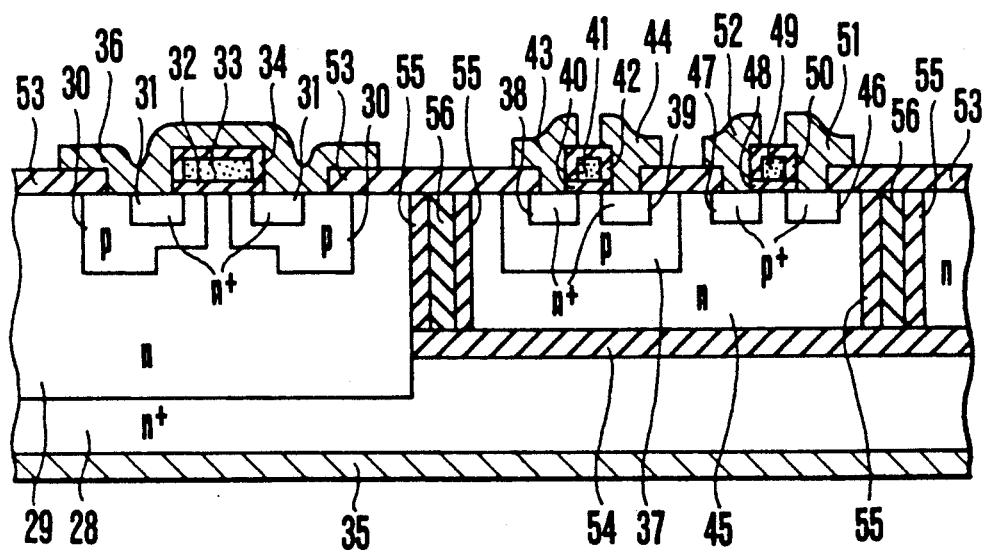
Figure 12:
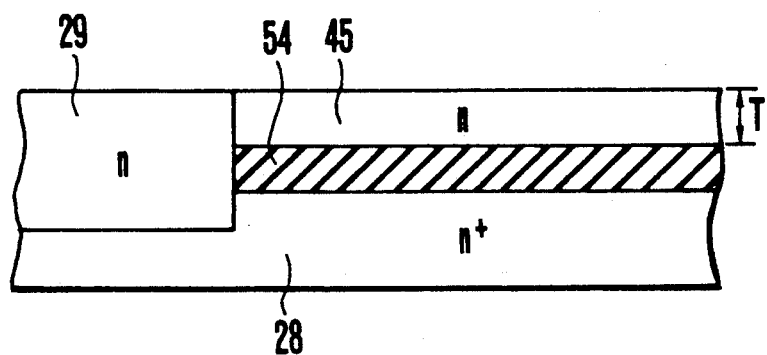
FIGS. 12a to 12g are sectional views showing manufacturing steps of a semiconductor device shown in FIG. 11.
Figure 12:
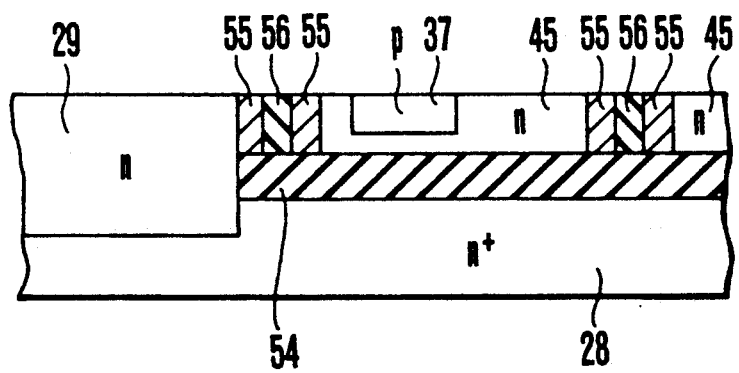

FIG. 9 shows a semiconductor device according to the fourth embodiment of the present invention. In the fourth embodiment, a high-voltage large-current n-p-n bipolar transistor is integrated instead of a high-voltage large-current MIS transistor. Referring to FIG. 9, reference numerals 116 and 117 denote an n-type emitter region and a p-type base region, respectively; and 118 and 119, an emitter electrode and a base electrode, respectively. The n-type drain region 58 and the drain electrode 64 shown in FIG. 1 correspond to an n-type collector region 58 and a collector electrode 64, respectively. In addition, portions of low- and medium-voltage complementary MIS inverters and portions of an isolation region have the same names as the corresponding portions in FIG. 1.

In a manufacturing method according to the embodiment shown in FIG. 7, two steps are added to the step (g) of the manufacturing method show in FIGS. 2a to 2j. These are steps for forming a p-type active region 59 and then a U-shaped groove shown in FIG. 7. Thereafter, the manufacturing process advances to formation of a gate-oxide film.

A difference between a manufacturing method according to the embodiment shown in FIG. 8 and that shown in FIGS. 2a to 2j is that the conductivity type of the crystalline Si substrate 57 with low resistivity in the step (a) is changed to a p-type in this embodiment.

A manufacturing method according to the embodiment shown in FIG. 9 is slightly different in the steps (g), (i), and (j) from the manufacturing method shown in FIGS. 2a to 2j. According to this embodiment, no gate-electrode material 62 is formed in the step (g). In the step (i), instead of forming the p-type active region 59 and the n-type source region 60, a p-type base region 117 and an n-type emitter region 116 shown in FIG. 8 are formed. In the step (j), instead of forming the source electrode 65, an emitter electrode 118 and a base electrode 119 shown in FIG. 8 are formed.

The polarity of the collector electrode 64 with respect to the emitter electrode 118 or base electrode 119 of the high-voltage large-current vertical n-p-n bipolar transistor shown in FIG. 9 is the same as that of the drain electrode 64 with respect to the source electrode 65 of the high-voltage large-current n-channel MIS transistor shown in FIG. 1. For this reason, even if the high-voltage large-current n-p-n bipolar transistor is integrated in place of the high-voltage large-current n-channel MIS transistor, the low- and medium-voltage complementary MIS inverter normally operates as in the first embodiment.

As has been described above, the present invention has the following excellent effects.

(i) The crystalline semiconductor layer sandwiched by the two-layered isolation insulating film located below the MIS transistors constituting the control complementary MIS inverter electrically shields the control MIS transistors from a high voltage applied on the drain or collector electrode of the high-voltage large-current vertical transistor. Therefore, no erroneous operation caused by a back channel occurs in the control MIS transistors. That is, the control complementary MIS inverter can be integrated with the high-voltage large-current transistor without causing an erroneous operation.

(ii) The high-voltage large-current vertical transistor and the MIS transistors constituting the control complementary MIS inverter are dielectrically isolated from each other. Therefore, since latch-up caused by noise or the like can be prevented, a reliability of various apparatuses adopting a semiconductor device of this structure is significantly improved.

(iii) Since the high-voltage large-current vertical transistor and the control complementary MIS inverter are dielectrically isolated, a high-voltage large-current transistor having a high voltage up to an insulation breakdown voltage of the isolation insulating film can be integrated.

What is claimed is:

1. A power semiconductor device comprising:
    a layered first insulating region formed adjacent and below a first major surface of a single crystalline semiconductor layer;
    a first conductive layer formed on said first insulating region and having the same conductivity type as that of said semiconductor layer;
    a layered second insulating region, formed on said first conductive layer;
    a vertical power transistor having said semiconductor layer as one of its components and formed on and below the first major surface of said semiconductor layer and laterally displaced from said first insulating region, said power transistor having a control input terminal;
    a third insulating region for dielectrically isolating said first conductive layer from a laterally adjacent portion of said semiconductor layer; and
    a first complementary MIS inverter formed on said second insulating region, for controlling said vertical power transistor, said first complementary MIS inverter having a source region and a drain region in contact with said second insulating region, said drain region being coupled to said control input terminal of said power transistor, and
    means for maintaining said source region and said first conductive layer at a predetermined bias to prevent formation of a back channel of said first complementary MIS inverter.

2. A device according to claim 1, wherein said semiconductor layer is formed on a semiconductor substrate having the same conductivity type.

3. A device according to claim 1, wherein said semiconductor layer is formed on a semiconductor substrate having a different conductivity type.

4. A device according to claim 1, wherein one of the components constituting said first complementary MIS inverter formed immediately above said first conductive layer via said second insulating region is connected to and applies a bias to said first conductive layer.

5. A device according to claim 4, wherein said one of the components of said first complementary MIS inverter is the source region.

6. A device according to claim 1, wherein said first complementary MIS inverter constituted by a first n-channel MIS transistor and a first p-channel MIS transistor, said MIS transistors being laterally spaced and formed on the upper surface of said second insulating region, the source region of said first n-channel MIS transistor being connected to and providing the bias on said first conductive layer.

7. A device according to claim 6, further comprising:
    a second conductive layer and a third conductive layer formed on the upper surface of said first insulating region;
    said second insulating region additionally overlying the upper surfaces of said second and third conductive layers;
    additional insulating regions, formed between said first and second insulating regions, for dielectrically isolating said second and third conductive layers from each other and from the first conductive layer; and
    a second complementary MIS inverter laterally spaced from said first complementary MIS inverter, said second complementary MIS inverter including a second n-channel MIS transistor formed over said second conductive layer and separated therefrom by said second insulating region and a second p-channel MIS transistor formed over said third conductive layer and separated therefrom by said second insulating region, a source of said second n-channel MIS transistor being connected to said second conductive layer, and a source of said second p-channel MIS transistor being connected to said third conductive layer.

8. A device according to claim 1, wherein said power transistor is a vertical MIS transistor.

9. A device according to claim 8, wherein a semiconductor layer arranged below said first insulating region is a drain region of said vertical MIS transistor.

10. A device according to claim 1, wherein said vertical power transistor is an n-p-n bipolar transistor, said semiconductor region located below said first insulating region being a collector region of said n-p-n bipolar transistor.

11. A device according to claim 1, wherein said power transistor is an IGBT (Insulated Gate Bipolar Transistor), said semiconductor layer located below said first insulating region being a drift region of said IGBT.

12. A device according to claim 1, wherein said first complementary MIS inverter is a lateral type MIS transistor.

* * * * *